(12) United States Patent
Witvrouw et al.

(10) Patent No.: US 8,536,662 B2
(45) Date of Patent: Sep. 17, 2013

(54) METHOD OF MANUFACTURING A SEMICONDUCTOR DEVICE AND SEMICONDUCTOR DEVICES RESULTING THEREFROM

(75) Inventors: Ann Witvrouw, Herent (BE); Luc Haspeslagh, Lubbeek-Linden (BE); Bin Guo, Leuven (BE); Simone Severi, Leuven (BE); Gert Claes, Kessel-lo (BE)

(73) Assignees: IMEC, Leuven (BE); Katholieke Universiteit Leuven, K.U. Leuven R&D, Leuven (BE)

( * ) Notice: Subject to any disclaimer, the term of this patent is extended or adjusted under 35 U.S.C. 154(b) by 388 days.

(21) Appl. No.: 12/955,629

(22) Filed: Nov. 29, 2010

(65) Prior Publication Data
US 2011/0127650 A1 Jun. 2, 2011

(30) Foreign Application Priority Data
Nov. 30, 2009 (EP) ...................................... 09177498

(51) Int. Cl.
*H01L 27/14* (2006.01)
(52) U.S. Cl.
USPC .................... 257/414; 257/415; 257/E29.106
(58) Field of Classification Search
USPC .................... 257/414, 415, E29.106
See application file for complete search history.

(56) References Cited

U.S. PATENT DOCUMENTS

| | | | |
|---|---|---|---|
| 6,478,974 B1 | 11/2002 | Lebouitz et al. | |
| 8,310,053 B2 * | 11/2012 | Verheijden et al. | 257/758 |
| 2002/0020053 A1 * | 2/2002 | Fonash et al. | 29/623.1 |
| 2004/0065932 A1 | 4/2004 | Reichenbach et al. | |
| 2006/0273065 A1 | 12/2006 | Kim et al. | |
| 2007/0042521 A1 | 2/2007 | Yama | |
| 2008/0135998 A1 * | 6/2008 | Witvrouw et al. | 257/678 |
| 2008/0188025 A1 | 8/2008 | Nakamura | |

FOREIGN PATENT DOCUMENTS

| | | |
|---|---|---|
| EP | 1433741 | 6/2004 |
| EP | 1672687 | 6/2006 |
| WO | WO2006/081636 | 8/2006 |
| WO | WO2007021396 | 2/2007 |

OTHER PUBLICATIONS

European Search Report, European Patent Application No. 09177498.4 dated May 21, 2010.

* cited by examiner

*Primary Examiner* — Trung Q Dang
(74) *Attorney, Agent, or Firm* — McDonnell Boehnen Hulbert & Berghoff LLP

(57) ABSTRACT

A method is disclosed for manufacturing a semiconductor device, including providing a substrate comprising a main surface with a non flat topography, the surface comprising at least one substantial topography variation, forming a first capping layer over the main surface such that, during formation of the first capping layer, local defects in the first capping layer are introduced, the local defects being positioned at locations corresponding to the substantial topography variations and the local defects being suitable for allowing a predetermined fluid to pass through. Associated membrane layers, capping layers, and microelectronic devices are also disclosed.

7 Claims, 10 Drawing Sheets

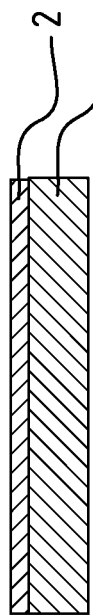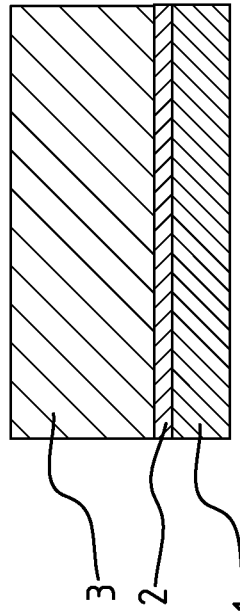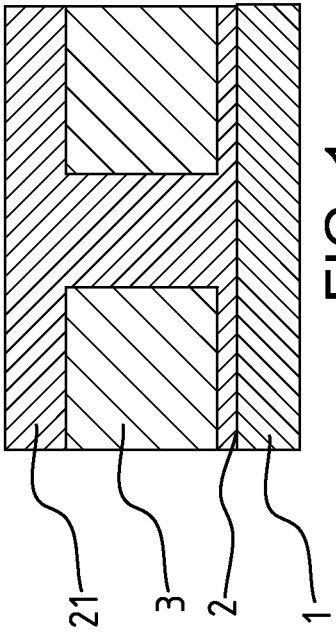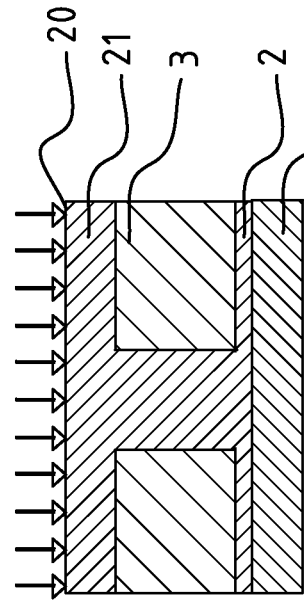

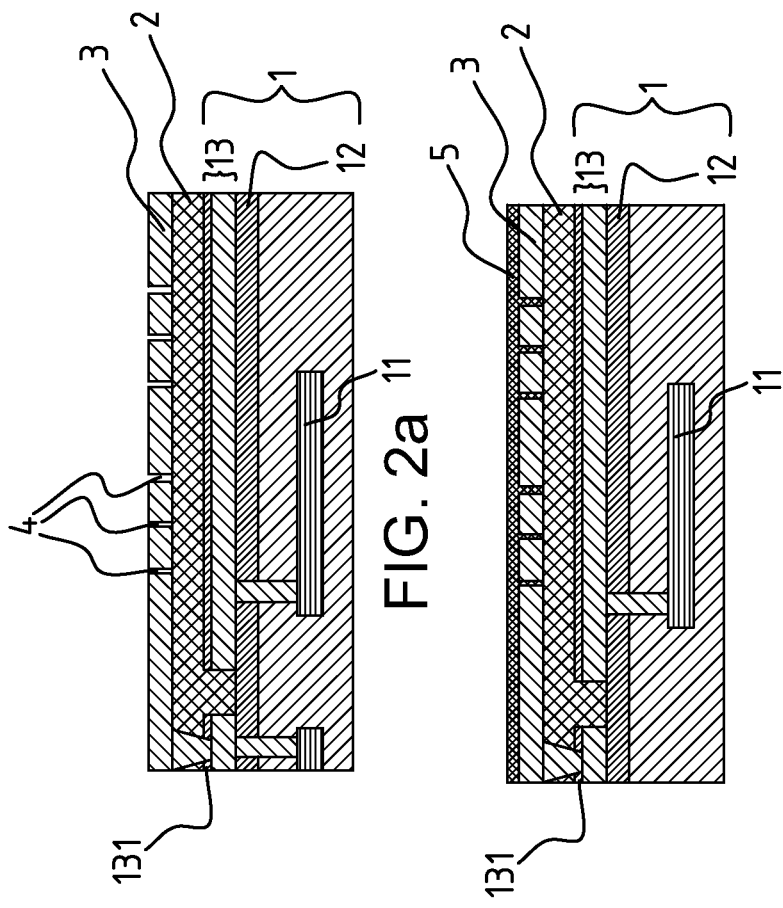
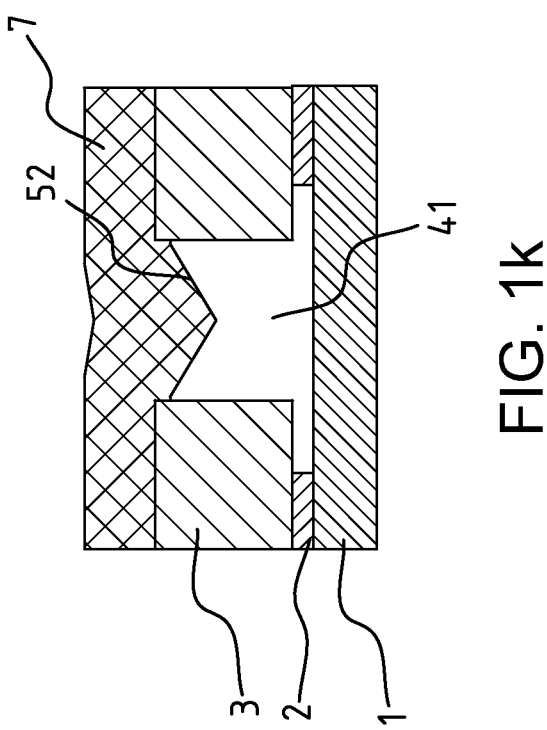

METHOD OF MANUFACTURING A SEMICONDUCTOR DEVICE AND SEMICONDUCTOR DEVICES RESULTING THEREFROM

CROSS-REFERENCE TO RELATED APPLICATIONS

The present application claims priority to European Patent Application EP 09177498.4 filed in the European Patent Office on Nov. 30, 2009, the entire contents of which is incorporated herein by reference.

TECHNICAL FIELD

The present disclosure is related to microelectronic process technology. In particular it relates to Micro- and Nano-Electro Mechanical Systems (MEMS and NEMS) process technology. Furthermore, the disclosure relates to a method for closing openings formed in a substrate, in particular to an encapsulation process of MEMS and NEMS devices.

BACKGROUND

In micro-electronics devices closure of openings formed in a layer is often needed to seal a cavity reachable via these openings to preserve the ambient of this cavity during further processing and use of the device.

Cavities may be formed as isolation trenches between devices such as bipolar transistors or high voltage devices or between interconnects lines. To improve their insulating properties, these trenches are filled with a gas, preferably ambient air, having a low dielectric constant. European patent application EP 1,672,687 discloses a method for forming these isolating trenches, also known as air gaps. This method for forming air gaps in a substrate comprises the steps of patterning a hole in the substrate, partly filling this hole with a sacrificial material, forming spacers on the sidewalls of the unfilled part of the hole to locally narrow the opening, removing at least part of the sacrificial material through the narrowed opening, and sealing the opening by depositing a sealing layer over the narrowed opening and surrounding spacers.

Another area in which cavities may be formed is the field of micro-electromechanical systems (MEMS), which often require an encapsulation under vacuum or under a controlled ambient and pressure in order to ensure either a good performance or an acceptable lifetime of operation. The encapsulation has to be performed without the deposition of sealing material on the MEMS device, which can cause damage to the device.

The most popular approach is based on wafer bonding. Here, the sealing is performed by connecting two wafers (device wafer and capping wafer) together by means of a re-flowable material.

Alternatively, encapsulation can be done by fabrication and sealing of surface micro-machined membranes. The use of conformal LPCVD (low-pressure chemical vapor deposition) films is a known method for encapsulation at low pressure. The sealing of the cavity comprising the MEMS devices is done while depositing the conformal film. Hence, the ambient and pressure of the sealed MEMS device are those of the deposition chamber.

Methods for sealing at higher pressures up to the order of atmospheric pressure and a few times that value, by the deposition of thin films, are however, not widespread.

Moreover, most of these atmospheric pressure techniques do not prevent material deposition inside the cavity. MEMS devices can be very fragile and deposition of material on the device is preferably avoided. Deposition of material on a MEMS device will also change the mass of the device and thus the resonance frequency, which also needs to be avoided.

The openings which are typically produced in the sealing membrane using current approaches have been etched, and are therefore sometimes quite large. Etching openings moreover requires patterning, masking steps, etc. that complicates the whole process of encapsulation. Such openings are provided mostly for allowing a sacrificial material etchant to reach out below the membrane or film, which had been supported temporarily by a sacrificial material, thereby dissolving or removing the sacrificial material and releasing the film, at least locally. The use of such a sacrificial material may be used in producing overhanging structures in packaging and MEMS processing technology.

In EP 1,433,741 a method is described for closing openings in a film, with a reflow material, the method comprising: depositing an intermediate layer on the film, which is thermally stable during reflow to thereby narrow down the opening to be sealed by formation of a collar or shoulder; depositing a reflow or sealing layer on the intermediate layer under a first set of pressure and ambient conditions to further partially close the opening, and reflowing the reflow or sealing layer under a second set of pressure and ambient conditions to close the opening by the reflow layer covering over the opening.

In EP 1,843,971 a method for removing a sacrificial material under a membrane is disclosed, the method comprising depositing a layer of sacrificial material; providing the membrane directly on top of the sacrificial material, making the membrane porous in another processing step such that pores and/or holes are formed which extend from the front surface to the back surface of the membrane, and applying a sacrificial material etchant for removing the sacrificial material until the sacrificial layer is at least partially removed by the sacrificial material etchant through the membrane.

There is a need for alternative method for closure of openings, in particular for zero-level or wafer level packaging solutions, which simplify process sequences, and which reduces the risk of having sealing material penetrating the area reachable through the opening, e.g., as for instance a cavity under the sealing membrane comprising, for instance, a fragile object such as a MEMS device.

SUMMARY

When terms as "first", "second", "third" and the like are used, this does not necessarily mean that a sequential or that a chronological order is to be assumed.

The term "comprising," should be interpreted as such that it does not exclude other elements or steps.

An object of the disclosure is to provide methods of manufacturing semiconductor devices, the methods comprising the step of closure of openings. It is an object of the disclosure to provide methods of encapsulation of semiconductor devices, as for instance Micro- and Nano-Electro Mechanical Systems (MEMS and NEMS) and methods for forming air gaps and to provide associated devices.

According to a first aspect of the present disclosure, a method for manufacturing a semiconductor device is disclosed, the method comprising
  providing a substrate comprising a main surface with a non flat topography, the surface comprising substantial topography variations;
  forming a first capping layer having an upper and lower surface over the main surface;

wherein, during formation of the first capping layer, local defects in the first capping layer are introduced, the local defects being positioned at locations corresponding to the substantial topography variations and the local defects being suitable for allowing a predetermined fluid to pass through.

The local defects are preferably suitable for allowing the predetermined fluid to be guided through the first capping layer. The local defects can preferably be formed such that they form pathways extending from the upper surface of the first capping layer towards the lower surface of the first capping layer.

The defects can be of different natures. The nature of the defects can be such that it comprises a local density variation of the capping layer material, for instance caused by a locally porous nature of the capping layer.

According to embodiments of the first aspect of the present disclosure, local defects or pathways are formed in a limited number of sections, substantially confined in the horizontal direction, i.e. parallel the surface of the first capping layer, of the first capping layer. The first capping layer further comprises, next to this limited number of sections, at least one horizontally confined section separating local pathways which is essentially defectless or essentially non-porous or which does not comprise defects so as to form pathways extending from the upper surface of the first capping layer towards the lower surface of the first capping layer and suitable for guiding the fluid through the first capping layer.

The local defects, local pores or local porosity are preferably formed during the formation step of the first capping layer, i.e. without an extra step suitable for introducing such defects after formation of the layer.

It should be noted that the presence or formation of only local defects as for instance the presence of local density variation or local porosity which is introduced into the first capping layer which can be further mainly non porous (thus a capping layer comprising also non-porous portions), provides an advantage compared to methods in which a completely porous capping layer would be provided. A layer which would be completely porous, for instance a porous silicon germanium capping layer, would allow HF to reach the interface between the front surface of the membrane layer and the first capping layer possibly resulting in a bad adhesion or a peel-of the first capping layer. Moreover, having a fully porous capping layer, as opposed to a capping layer comprising only local defects or local porosity regions within a further mainly non porous capping layer, would allow a fluid (as for instance an etching agent as HF) to diffuse along the capping layer towards locations further on in the wafer where their presence is not wanted.

The first capping layer is preferably formed by deposition.

According to preferred embodiments of the first aspect of the present disclosure, the formation of the first capping layer comprises depositing the layer with a directional deposition technique.

The first capping layer can be deposited by a deposition technique such as for instance plasma vapor deposition (PVD), evaporation, or plasma enhanced chemical vapor deposition (PECVD).

It can be deposited under a deposition angle which is substantially orthogonal on the front main surface of the wafer or substrate.

When the capping layer is deposited by means of a directional depositing technique, on a surface with a non-flat topography, an irregular stacking process occurs at (or adjacent to) locations where the topography of the underlying surface strongly varies. For the purpose of the present disclosure a layer or surface having a non flat topography should be seen as a layer which is at least not completely flat, and which comprises substantial variations in the orientation of front surface with respect to the main front surface of the underlying wafer or substrate. Preferably the layer or surface comprises at least one recess or through hole, the recess or hole comprising at least one sidewall which is oriented inclined with an angle $\alpha$ of more than 45, more than 50, more than 55, more than 60, more than 65, more than 70, more than 75, more than 80, more than 85, or substantially vertical on the front surface of the underlying substrate's main surface. Thereby a well localized porosity structure can be introduced in, for instance, the first capping layer, the porous structure comprising pores which have dimensions (expected to be in the order of 1 to 20 nm) that allow the passing through of molecules of the etching agent, for instance the passing through of molecules of hydrogen fluoride (HF) vapor phase molecules. The defects can thus be provided or present adjacent to the sidewalls of the recesses or through-holes.

The thickness of the first capping layer is preferably between 50 nm and 1 um. According to several embodiments the first capping layer comprises germanium, silicon, or silicon germanium.

The method can preferably be performed on a substrate or wafer, as for instance a silicon or germanium wafer, or in principle any wafer.

According to some embodiments of the first aspect of the present disclosure, any of the previously described embodiments of the first aspect of the present disclosure can further be such that the locations of the substantial topography variations are predetermined.

It should be noted that by providing a predetermined topography of an underlying surface for a first capping layer, one can control the location of the creation of the defects, as for instance the local porosity, to a very high degree.

The local defects can thus be introduced at predetermined locations by providing topography variations of the underlying surface in accordance with the predetermined locations of the defects. The topography can be defined by at least one or a multitude of recesses, through-holes, or trenches.

According to embodiments of the first aspect of the present disclosure, any of the previously described embodiments of the first aspect of the present disclosure can further be such that providing a substrate comprising a main surface with a non flat topography comprises providing a sacrificial layer on the substrate, at least a portion of the sacrificial layer being arranged for abutting the local defects in the first capping layer, and wherein the local defects are suitable for allowing a removal agent for the sacrificial layer to pass through. The predetermined locations can preferably correspond to locations where the sacrificial layer is to be removed below the capping layer.

The sacrificial layer can be formed by deposition, as for instance by chemical vapor deposition (CVD), or by plasma enhanced CVD (PECVD) where the plasma can be a high density plasma (HDP), or by spin coating.

The sacrificial layer is preferably located where a micro cavity is to be located or a trench is to be filled or to be formed in the resulting semiconductor device.

The sacrificial layer can comprise or consist of silicon oxide ($SiO_2$), but other sacrificial materials are not excluded. Examples of such other sacrificial materials forming the sacrificial layer are resist, a metal layer such as Al, or a Ge or Si layer.

The sacrificial layer can in principle have any thickness, but the thickness is preferably between 1-5 micrometer below the MEMS device and 1-5 micrometer between the MEMS device and the encapsulating layer. The sacrificial layer is, in addition, also located in the etched trenches and holes in the MEMS structural layer.

In embodiments wherein the sacrificial layer is to be removed through the local defects in the first capping layer, the fluid comprises a removal agent. It can, for instance, comprise or consist of HF dissolved in water or ethanol, buffer HF or vapor HF to be guided through the first capping layer towards the sacrificial layer and is suitable for allowing the reaction products of the reaction between the sacrificial layer and the removal agent/dissolved elements of the sacrificial layer to be guided back outwards (for instance substantially in the opposite direction) through the first capping layer.

The sacrificial layer below the capping layer can, according to certain embodiments, define a microcavity comprising a device as for instance a micro electro-mechanical system (MEMS) device.

According to several embodiments the removal process of at least part of the sacrificial layer comprises a removal or etch process for which the duration is controlled in order to remove predetermined portions of the sacrificial layer.

By limiting the duration of the etching process, or the removal process more generally, one can for instance provide air gaps below the first capping layer without removing the sacrificial layer completely. This can be useful for certain applications, as for instance in a production process for a microphone.

According to embodiments of the first aspect of the present disclosure, any of the previously described embodiments of the first aspect of the present disclosure can be such that providing a substrate comprising a main surface with a non flat topography comprises providing a membrane layer on the substrate, the membrane layer comprising the substantial topography variations.

According to advantageous embodiments of the present disclosure the membrane layer comprises a material (a membrane material) that is substantially not removable by the removal agent. The at least one recess can comprise or consist of a through hole, which is a hole extending through the membrane layer. The position of those through-holes preferably correspond (or lie adjacent) to the locations where local defects are to be introduced in the first capping layer which is provided on top of the membrane layer. The sidewalls of the recesses or the through-holes preferably define the location of the local defects in the above deposited capping layer. These sidewalls are preferably substantially orthogonal on the front main surface of the wafer.

The local defects can be limited to predetermined portions of the first capping layer, with a precision that is correlated to or is a function of the precision of patterning of the membrane layer or sacrificial layer below it. This can be a function of the precision in the lithographic techniques used for providing recesses and/or holes and/or trenches in the membrane layer or sacrificial layer. The region of the first capping layer which comprises defects which can be considered as comprising pores, can thus be defined with a precision of 1 micrometer.

According to further embodiments of the present disclosure, the through-holes or recesses in the membrane layer can be at least partially filled up with sacrificial material until an average level does not extend above the main front surface of the membrane layer. Preferably it can be filled up until an average level below the front surface of the membrane. The filling up of the holes or recesses can comprise different sub processes, for instance first a second sacrificial layer can be deposited over the whole wafer which can be etched back in order to remove the second sacrificial layer from the front main surface and to leave only a part of second sacrificial material within the holes or recesses.

According to embodiments of the present disclosure a through hole in the membrane layer can be at least partially filled up, or can be completely filled up, with the material of the first capping layer, when providing the first capping layer on top or above the membrane layer. The latter embodiments may be advantageously used if the thickness of the membrane layer is relatively small, e.g., less than 1 micrometer.

According to embodiments of the present disclosure wherein the recess or through hole in the membrane layer is at least partially filled up with a further sacrificial material (which can be the same as the material comprised in the first sacrificial layer, for instance silicon oxide), the method according to embodiments of the present disclosure may comprise providing a further recess located at and in the upper surface of the sacrificial layer in the through hole or recess. At least one such further recess can be provided, but a plurality of such recesses can be provided at predetermined locations within the upper surface of the sacrificial layer in the through hole.

Under certain circumstances, the etch back process of the sacrificial material in the holes may automatically introduce a recess in the central portion of the holes, as well as near or adjacent to the sidewalls of the holes.

According to aspects of the present disclosure only part of the sacrificial layer or material below the first capping layer and below and in the membrane layer is removed by controlling the application time or duration of the etching agent.

According the some embodiments the removal agent comprises HF, or consists substantially of HF. HF will remove a Si-oxide sacrificial layer. Other examples include oxygen plasma in case a resist sacrificial layer is used, $H_2O_2$ if a germanium sacrificial layer is used, etc.

An aspect of the methods according to embodiments of the present disclosure in which a sacrificial layer situated below a membrane layer is removed by means of a removal agent that passes through a membrane layer, is that the capping layer is provided on top of the membrane layer, before the sacrificial layer removal process (or release), as may be present in other methods.

According to embodiments of the first aspect of the present disclosure, any of the previously described embodiments of the first aspect of the present disclosure can further comprise sealing the first capping layer. For instance, the first capping layer can comprise Silicon Germanium and the sealing can comprise depositing a second capping layer, for instance comprising Aluminum, on top of the first capping layer, and performing an anneal process thereby transforming the first and the second capping layer into a single sealing layer. The single sealing layer can be uniform.

The capping layer needs to be sealed afterwards without allowing material of the sealing layer to pass into the cavity, for instance when this cavity comprises a fragile object. When the holes in the membrane (typically 1-3 micrometer in diameter) would not be covered, the deposition conditions of the capping layer would need to be controlled in order to reduce the amount of material entering the cavity. According to embodiments of the present disclosure, the sealing of the cavity can be performed at any predetermined pressure without incurring this risk, as the defects or pores do not allow the passing through of sealing layer material when provided on top of the first capping layer. The first capping layer can be seen as being part of, or being a sub layer of, the sealing layer. The deposition of the sealing layer can be performed at pressures up to atmospheric pressure.

Any of the embodiments of the first aspect of the present disclosure can thus further comprise, next to the provisioning of a first capping layer:

providing a second capping layer, the capping layer for instance comprising or substantially consisting of aluminum; or an Al-alloy such as Al—Cu or Al—Si—Cu.

providing an anneal step or temperature step (preferably at a CMOS compatible temperature, preferably below 450° C., preferably below 425° C., preferably below 400° C.) resulting in a uniform sealing layer replacing any previously present capping layers. The uniform sealing layer preferably reflows thereby forming a continuous layer without any holes. This can for instance be the case when the uniform sealing layer is manufactured by annealing an aluminum layer on a silicon germanium layer thereby creating a silicon germanium aluminum (SiGeAl) layer, which has the characteristic of melting at a lower temperature than the melting temperature of the individual components.

In one embodiment, this annealing step is performed during the deposition of the second capping layer at an elevated, but still CMOS-compatible, temperature. The sealed-in pressure will be determined by the deposition pressure.

In another embodiment this annealing is done after deposition of the second capping layer, but without removing the wafer from the deposition chamber. The sealed-in pressure will be determined by the base pressure of the deposition tool.

In yet another embodiment this annealing is done after deposition of the second capping layer, but without removing the wafer from the deposition cluster tool (e.g., in an annealing chamber on the same cluster tool as the deposition chamber). The sealed-in pressure and ambient will be determined by the predetermined pressure and ambient in the annealing chamber. No oxidation of the capping layers is expected as the wafer has not yet been removed from the vacuum and the reflow temperature is therefore still the same as after deposition of the second capping layer.

In yet another embodiment this annealing is done in an annealing chamber not connected to the deposition tool. The sealed-in pressure and ambient will be determined by the chosen pressure and ambient in the annealing chamber.

According to any of the previous embodiments of the first aspect of the present disclosure, the method can further comprise depositing a barrier layer between the membrane layer and the first capping layer, either before or after producing holes in the membrane layer. In case this barrier layer is deposited after producing holes in the membrane layer, it should also comprise defects at the predetermined locations. This barrier layer can for instance comprise or substantially consist of silicon carbide (SiC), TiN or TaN. The barrier layer may prevent the in-diffusion of aluminum into the device or substrate.

According to a second aspect of the present disclosure, a capping layer is disclosed having a non-flat topography, the capping layer comprising defects, the defects being suitable for allowing a predetermined fluid to pass through, wherein the defects are present at locations in the capping layer where its topography is substantially varying.

According to embodiments of the second aspect of the present disclosure, at least the lower surface of said capping layer has a non flat topography above said cavity.

According to some embodiments, the device comprises a membrane layer below the capping layer comprising defects, the membrane layer comprising at least one through hole, the walls of the through hole positioned adjacent to the local defects in the capping layer. These local defects in the capping layer, which can be of the pore type, can provide pathways extending from the upper surface of the capping layer towards the lower surface of the capping layer. These pathways can allow a fluid to pass through. These pathways can be suitable for guiding the fluid. The local defects or pathways are preferably present in a limited number of confined sub sections of the capping layer. These confined subsections can be confined by the upper and lower surface of the capping layer and by at least one substantially vertically oriented confinement surface.

According to embodiments of the present disclosure, the device comprises at least one protrusion positioned on the lower surface of the first capping layer, extending into the cavity, the protrusion comprising defects which would allow a removal agent to pass through.

The defects in the protrusion preferably extend towards the front surface of the first capping layer, such that a pathway is formed extending from the upper surface of the capping layer towards the lower surface of the first capping layer. These pathways can allow the removal agent to pass through. These pathways are preferably suitable for guiding the removal agent.

A well localized defect structure or pathway can be present in the first capping layer, the defect structure comprising defects which have dimensions that allow the passing through of molecules of the etching agent, for instance the passing through of molecules of the hydrogen fluoride (HF) vapor phase molecules.

According to a third aspect of the present disclosure, a membrane comprising a stack of a first layer and a capping layer is disclosed, the first layer comprising holes and the capping layer in physical contact with the first layer, the capping layer comprising local defects positioned at the sidewalls of the openings, and the local defects being suitable for allowing a predetermined fluid to pass through.

According to some embodiments, the material of the capping layer fills the holes completely, and the defects are also present in the through hole.

According to embodiments of the third aspect of the present disclosure, the membrane comprises a sealing layer for the capping layer. The sealing layer can comprise SiGeAl, can comprise a SiGeAl layer, or can consist of a single SiGeAl layer.

According to a fourth aspect of the present disclosure, a microelectronic device comprising a cavity covered by a capping layer according to embodiments of the second aspect of the present disclosure is disclosed.

According to a fifth aspect of the present disclosure, a microelectronic device comprising a cavity covered by a membrane according to any of the embodiments of the third aspect is disclosed.

Features and embodiments for the second and further aspects of the present disclosure corresponding to features and embodiments of the first aspect of the present disclosure are similarly considered to be within the scope of the present disclosure.

Further aspects of the present disclosure are described by the dependent claims. The features from the dependent claims, features of any of the independent claims and any features of other dependent claims may be combined as considered appropriate to the person of ordinary skill, and not only in the particular combinations as defined by the claims.

BRIEF DESCRIPTION OF THE DRAWINGS

The accompanying drawings are used to illustrate embodiments of the present disclosure.

FIGS. 1a-1k illustrate process flows according to embodiments of the present disclosure.

DETAILED DESCRIPTION

Figure 1G:
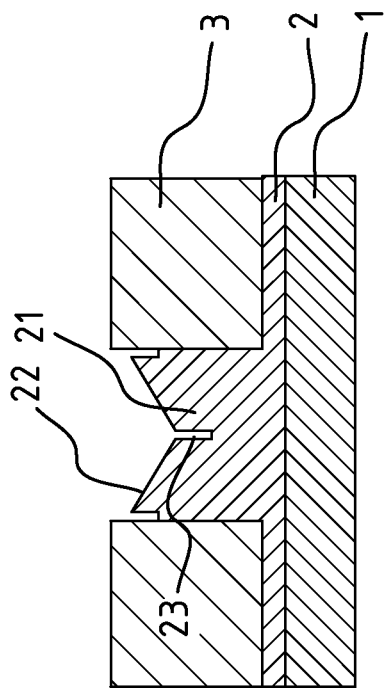
Figure 1G:
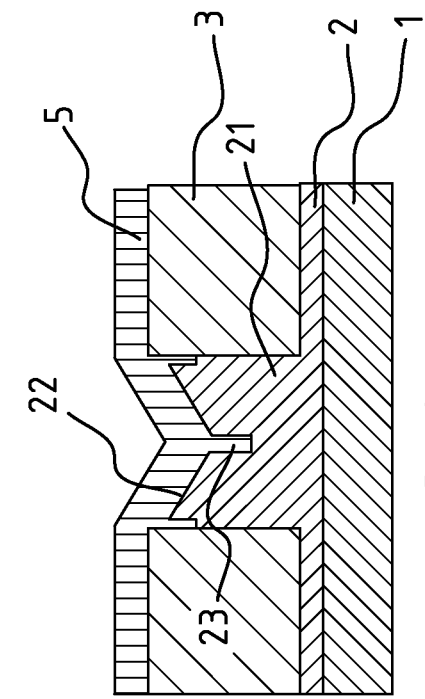

The above and other advantageous, features, and objects of the disclosure will become more apparent and the disclosure will be better understood from the following detailed description when read in conjunction with the respective drawings.

The description of aspects of the present disclosure is performed by means of particular embodiments and with reference to certain drawings but the disclosure is not limited thereto. Depicted figures are only schematic and should not be considered as limiting. (e.g., certain elements or features may be shown out of proportion or out of scale with respect to other elements).

In the description of certain embodiments according to the present disclosure, various features are sometimes grouped together in a single embodiment, figure, or description thereof for the purpose of aiding in the understanding of one or more of the various inventive aspects. This is not to be interpreted as if all features of the group are necessarily present to solve a particular problem. Inventive aspects may lie in less than all features of such a group of features present in the description of a particular embodiment.

FIG. 1 illustrates a process flow according to embodiments of the present disclosure. In FIGS. 1a-1c, a semiconductor wafer or substrate 1, for instance a silicon or germanium wafer, is provided, after which a first sacrificial layer 2 is provided (for instance deposited or grown thereupon) comprising for instance silicon oxide. Next a membrane layer 3 is provided on top of the silicon oxide layer 2.

The membrane layer can, for instance, comprise silicon germanium, silicon, germanium, nickel, Si-oxide, silicon carbide, etc. FIG. 1d illustrates the step of providing a non-flat topography to the membrane layer 3. In this embodiment the topography variations are created by providing through-holes 4 extending completely through the membrane layer 3, the holes 4 further having substantially vertical sidewalls, typically created by lithographic processes. The sidewalls of the holes 4 can, in principle, also have different orientations. They can, for instance, be inclined with respect to the front surface of the wafer 1. The membrane layer can have a thickness of 1 to 50 micrometers.

Here, a membrane layer 3 of silicon germanium (SiGe) or silicon carbide (SiC) is provided, but other appropriate materials are not excluded, as will be recognized by the skilled person.

In FIG. 1e a further sacrificial layer 21 is provided (for instance deposited), possibly comprising the same materials as the first sacrificial layer 2 in order to at least partially fill up the recess or through hole. Typically the further sacrificial layer 21 material will cover also the front surface 20 of the intermediate semiconductor device. Therefore, removal of the sacrificial material on the front surface 20 and partially in the opening 4 of the intermediate semiconductor device can be performed by, for instance, dry or wet etching or other techniques known by the skilled person. This is depicted in FIG. 1f.

In FIG. 1g a typical shape of the surface 22 of the sacrificial layer in the recess or through hole 4 of the membrane layer 3 is depicted. This front surface 22 can have a substantially V- or U-shaped cross section. A topography variation in the membrane layer 3, defined by the sidewalls of the recess or through hole, is provided. Under certain etching conditions, for instance when using wet HF or BHF for a silicon oxide sacrificial layer, small recesses positioned next to the sidewalls of the hole 4 and centrally positioned within the opening 4 are formed without the need for an explicit further lithographically defined step.

In FIG. 1g' optionally a further, relatively small, recess or trench 23 (optionally a multitude of these recesses 23) can be provided, which can cause a further topography variation in the surface of the intermediate semiconductor device.

Figure 1H:
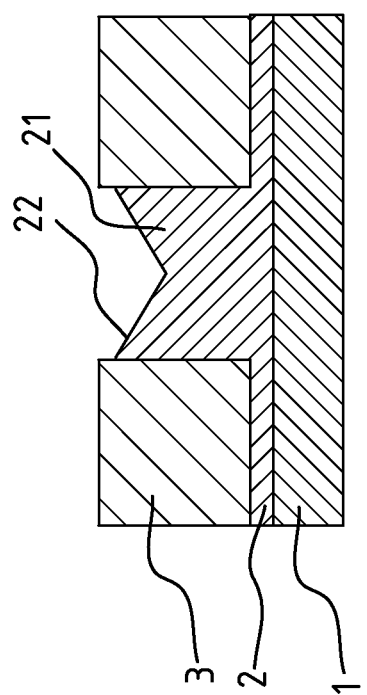
Figure 1H:
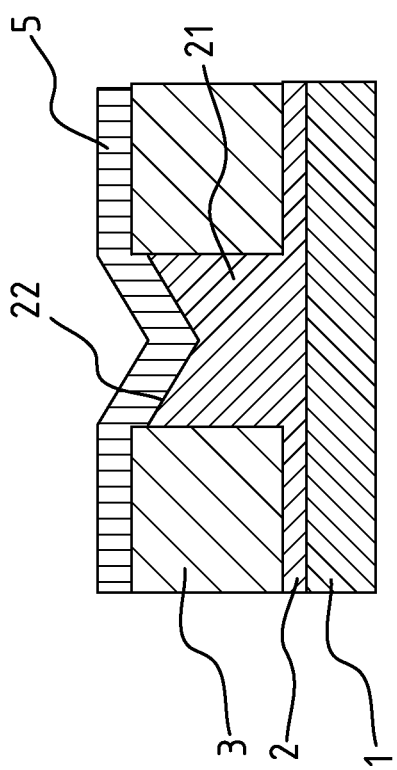
Figure 3:
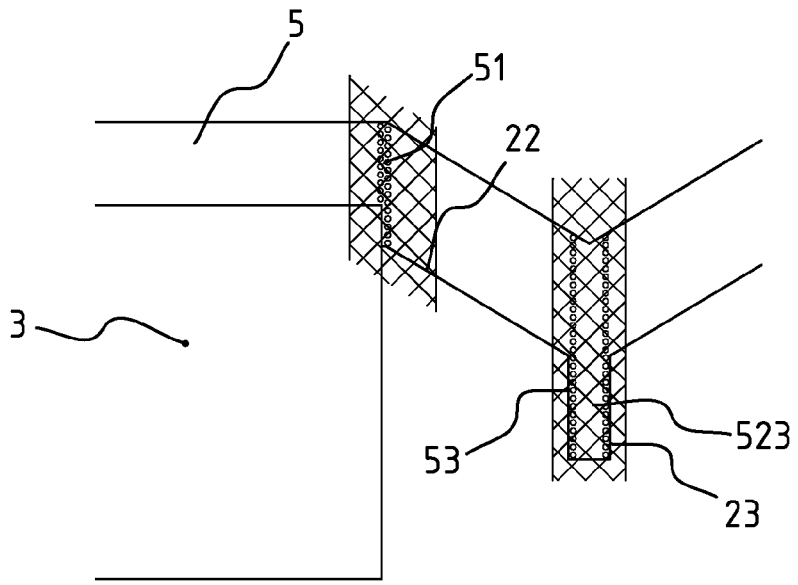
FIG. 3 illustrates a detail view of a portion of a semiconductor device according to embodiments of the present disclosure.

At this moment in the process flow, and referring to FIGS. 1h and 1h', a first capping layer 5 can be deposited which can, for instance, comprise or consist of micro crystalline or amorphous silicon, silicon germanium, germanium, silicon carbide, silicon nitride, diamond, etc. As illustrated in FIG. 3, the fact that the formation (for instance deposition) of the first capping layer 5, preferably by a directional deposition technique, is performed on a surface with a non-flat topography, whereby the topography, more specifically the substantial topography variations of the surface, is very well controlled, allows for the introduction of local defects 51, 53 near the sidewalls of the opening 4 in the membrane layer 3 or near the sidewalls of the central trenches 23, respectively. These local defects are then at predetermined locations of the intermediate semiconductor device, within horizontally confined sections of said capping layer (hatched sections). Note also that the lower surface of the capping layer comprises protrusions 523 filling up the trenches 23 in the sacrificial layer with upper surface 22. It is believed that the nature of the localized defects 51, 53 provided by the deposition of the first capping layer 5 by means of a directional deposition method is caused by an irregular stacking of molecules or atoms nearby the topography variations, which can, for instance, be caused by the fact that badly stacked atoms or molecules are preventing further provided atoms or molecules from passing behind them and filling up possibly created gaps below the previously deposited molecule or atom.

It should be noted that in the embodiments illustrated by FIG. 1h' further defects 51, typically in the form of strong density variations or local porosity are introduced by the substantial topography variation or variations provided by the recess(es) or trench(es) 23.

It has been found that the defects created by this topography variation combined with a directional deposition method provides defects which are suitable for allowing molecules of the etching agent to pass through, and are suitable for guiding the molecules of the etching agent towards the underlying sacrificial layer.

This combination allow for the removal of the sacrificial layer from below the first capping layer through these defects or pores.

Figure 1I:
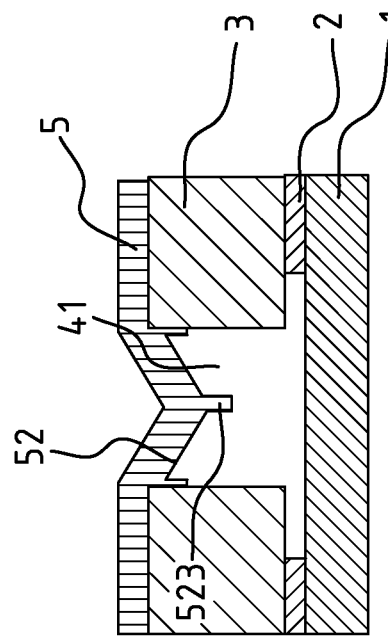
Figure 1I:
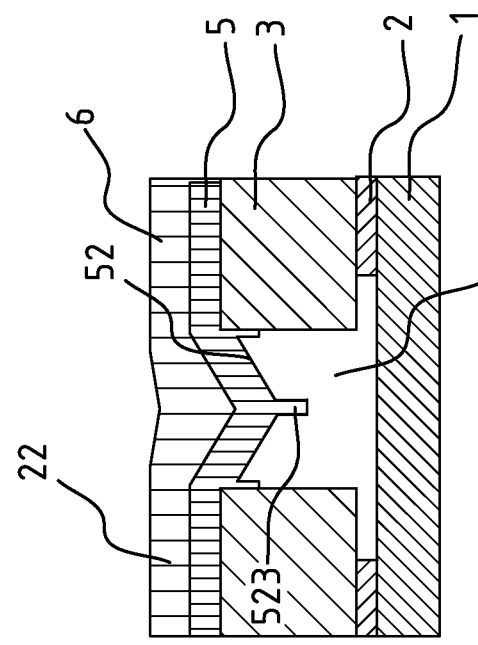

In FIGS. 1i and 1i' the removal process of the sacrificial layer 2, 21 under the first capping layer 5 through the local defects 51, 53 present at predetermined positions in the capping layer 5 is illustrated, resulting in a micro cavity 41 below the first capping layer 5. This micro cavity 41 can typically comprise a micro electro mechanical system device (not depicted) or any other device, which does require sealing, and which can be fragile in the sense that its functioning would be strongly influenced or damaged if sealing material were deposited on it.

Figure 4A:
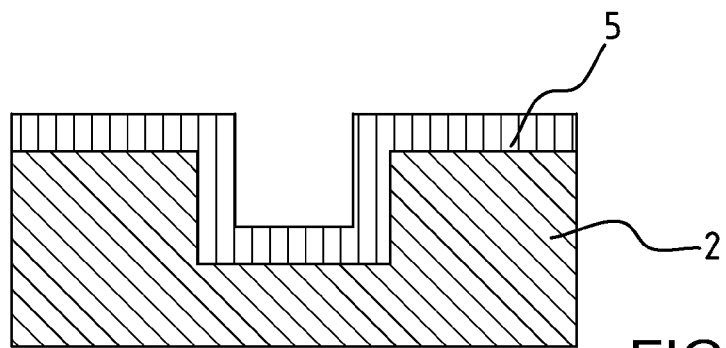
FIGS. 4a and 4b illustrate embodiments of the present disclosure wherein portions of the sacrificial layer are removed through defects in the capping layer.
Figure 4B:
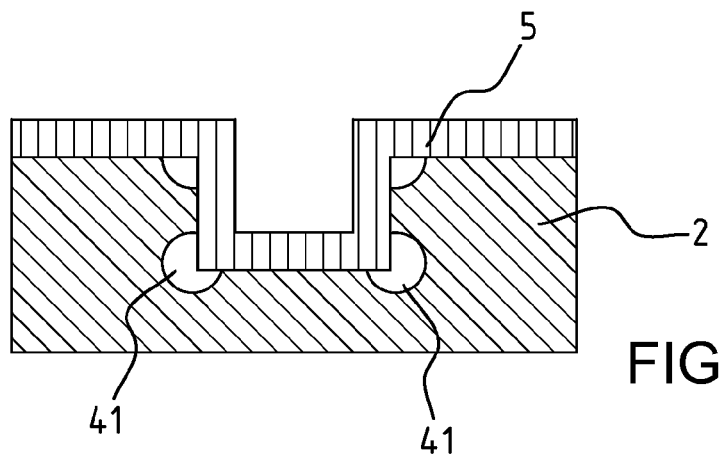

By controlling the duration of the application of the removal agent, as for instance HF vapor (hydrogen fluoride in the gas phase), to the sacrificial layer 2, 21, for instance a silicon oxide sacrificial layer, the amount of removed material below the first capping layer 5 can be controlled. Moreover, by appropriately defining the position of the sacrificial layer 2, 21, the membrane layer 3 and its corresponding recesses or through-holes 4 as well as optionally the location or presence of one or more further recesses 23 in the upper surface of the sacrificial layer 21 being present within the holes 4 of the membrane layer 3, it is possible to control the dimensions and locations of the resulting air gaps 41 in the intermediate or final semiconductor device. This is also illustrated in e.g., FIGS. 4a-4b and FIG. 2c.

Figure 1J:
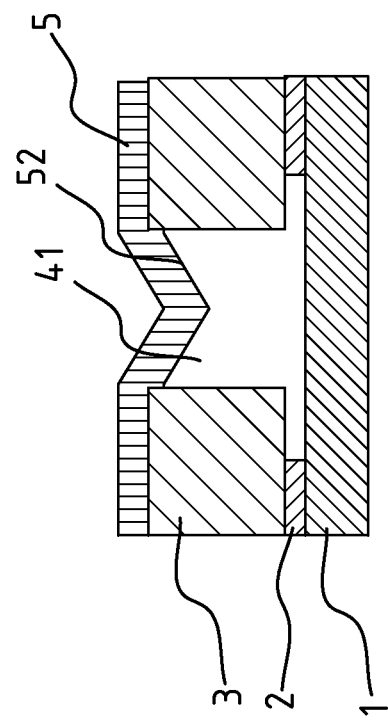
Figure 1J:
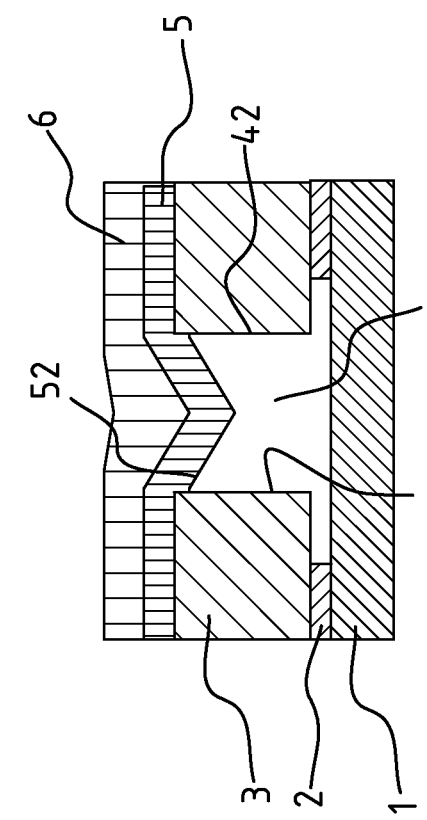

While the first capping layer can have certain sealing properties in and of itself, a further, second capping layer can be provided on top of it in order to improve or complete sealing of the cavity 41, as shown in FIGS. 1j and 1j'. Therefore, for instance, a further layer of silicon germanium or silicon carbide can be provided on top of the first capping layer 5, but also other materials such as a metal layer can be used. According to advantageous embodiments, a predetermined thickness of the first capping layer 5 is chosen, possibly as a function of the nature and/or location of topography variations, such that it is adapted to allow an easy removal of the sacrificial layer 2, through it. According to certain embodiments, the thickness of the first capping layer is preferably relatively small, comprised within the closed interval of 50 nm to 1 um. A second capping layer 6 can then be provided after removal of the sacrificial material to fully seal the cavity 41.

According to several embodiments, a further layer can be provided on top of the first, and in certain embodiments on top of the first and the second capping layer. This further capping layer can be, for instance, an aluminum layer which can be provided by sputtering, but also by any methods known to the skilled person, such as, for example, evaporation.

According to some embodiments an anneal step can be provided to the intermediate semiconductor device whereby the deposited aluminum capping layer and the first 5 and optionally second 6 capping layer comprising silicon germanium are merging into a single uniform sealing layer 7 comprising or substantially consisting of silicon germanium aluminum (SiGeAl) (FIG. 1k). The anneal step is preferably performed at a temperature which is CMOS compatible, as the underlying wafer can be a CMOS wafer according to preferred embodiments. This means that the anneal temperature is preferably below 450° C. or below 420° C. or below 400° C.

The anneal step can be performed during the deposition of the further capping layer at an elevated, but still CMOS-compatible, temperature.

The anneal can also be performed after deposition of the further capping layer, but without removing the wafer from the deposition chamber.

The anneal can also be performed after deposition of the further capping layer, but without removing the wafer from the deposition cluster tool (e.g., in an annealing chamber on the same cluster tool as the deposition chamber). No oxidation of the capping layers is expected as the wafer has not yet been removed from the vacuum and the reflow temperature is therefore still the same as after deposition of the second capping layer.

The anneal can also be performed in an annealing chamber not connected to the deposition tool.

Figure 2C:
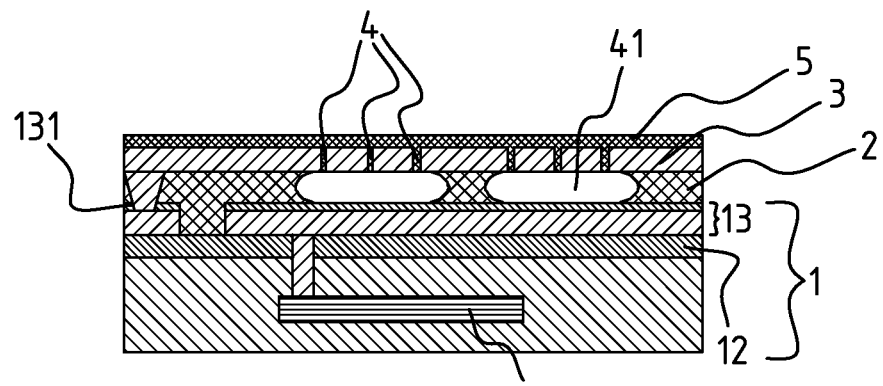
FIG. 2 illustrates a further embodiment of the present disclosure, in which a controlled timing of the removal process through a membrane of the sacrificial layer underlying the membrane occurs in order to provide air gaps at predetermined locations below the membrane.
Figure 2D:
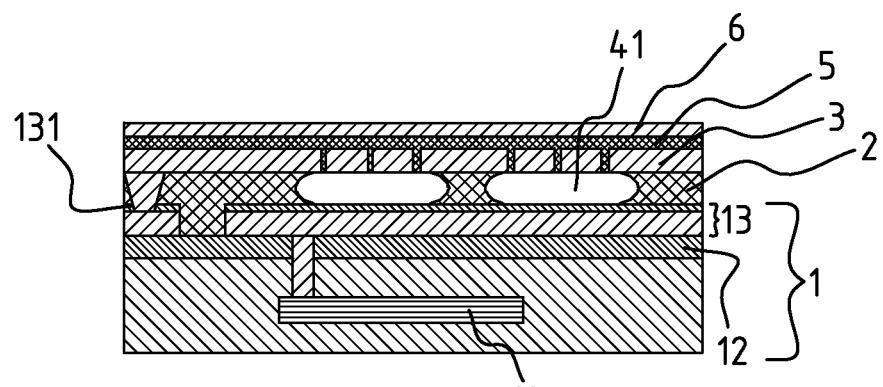
Figure 2E:
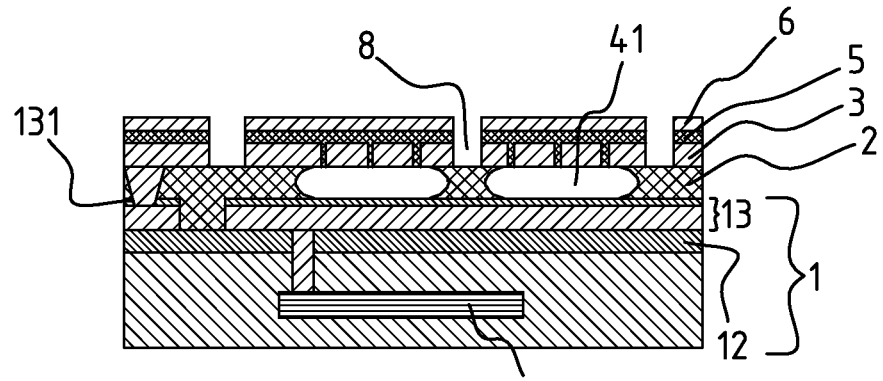

In FIG. 2 a possible application of embodiments according to the present disclosure is depicted, in which the underlying silicon wafer or substrate comprises a CMOS wafer, or a wafer comprising at least one metal interconnect, comprising a metal interconnect 11, a protection layer (for instance silicon carbide) 12 and an electrode 13 on top of the protection layer, the electrode 13 can optionally comprise a silicon carbide top insulator 131. Above the structure a sacrificial layer 2, for instance, a silicon oxide has been provided, on top of which a membrane layer 3 is produced, together with a series of through-holes 4. Then, for instance, a locally porous silicon germanium first capping layer 5 can be provided on top of the membrane layer 3, thereby filling the through-holes 4 in the membrane. Please note that in this embodiment the through-holes 4 in the membrane 3 are substantially or completely filled by the material of the first capping layer 5, different than for instance in embodiments where these holes are at least partially filled with a further sacrificial material. The deposition of the first capping layer 5 on the membrane layer 3, the membrane layer 3 comprising a substantial topography variation at the location of the through-holes 4, causes a strong density variation or local defect creation or local porosity creation at these substantial topography variations defined by the substantially vertical sidewalls of the openings 4 in the membrane 3 (FIG. 2b). A release step can then be performed by applying for instance a removal agent, as for instance HF in the vapor phase, which penetrates through the local defect(s) in the first capping layer 5 and removes the sacrificial layer 2 below the capping layer 5, in this case also below the membrane layer 3, as the membrane layer 3 is resistant to the removal agent (FIG. 2c). By controlling the duration of the etching step, cavities 41 with controlled dimensions and locations can be created under the membrane layer 3. After the (partial) release of the membrane a further sealing layer 6 can be applied (for instance a CVD deposited layer), further sealing the cavities 41 sufficiently, without introducing any sealing material into the created cavities (FIG. 2d). The cavities may comprise fragile devices such as for instance MEMS devices (not depicted). In FIG. 2e the individual membranes can then be separated by providing appropriate holes and/or trenches 8 into the membrane layer 3.

It will be appreciated by the skilled person that the above described embodiments according to the present disclosure depicted in the figures can be applied for the manufacturing of structures which can be incorporated in microphones or pressure sensors.

An example of a detailed process flow embodying aspects of the present disclosure is described below.

The methods discussed above for closure of openings 4 formed in a layer 3 can also be applied to the closure of gaps formed in a layer or substrate to electrically isolate adjacent electronic components such as transistors or interconnect lines. An example of such isolating structures, also known as air gaps, can be found in front end of line processing (FEOL) where isolation structures such as field oxide or shallow trench isolation (STI) do not provide sufficient electrical isolation between adjacent components such as bipolar transistors or high voltage transistors. Another example of such isolating gaps can be found in back end of line processing (BEOL) where even low-k dielectric materials, separating interconnect lines, having a relative dielectric constant as low as 2, still form a major capacitive load to the signals conveyed by these interconnect lines, thereby reducing the speed at which signals can be transmitted over these interconnect lines.

A better electrical isolation can be obtained by introducing a gap or cavity between these components and by controlling the ambient created in this gap. In a case of a BEOL interconnect scheme one may opt to completely remove the dielectric surrounding the conductive lines of the interconnect scheme to further reduce the capacitive coupling between the conductive lines. Typically this gap is filled with air, having a relative dielectric constant of 1. To allow further processing, thereby preserving the ambient of this gap, the entrance to this cavity must be closed.

FIGS. 5a-5h illustrate a method for the closure of a cavity formed in a FEOL process. An example of such cavity is a deep trench air gap in an active area-field isolation module in a BiCMOS device. BiCMOS deep trenches have a typical trench depth of about 6 micron and a diameter of about 1 micron.

Figure 5A:
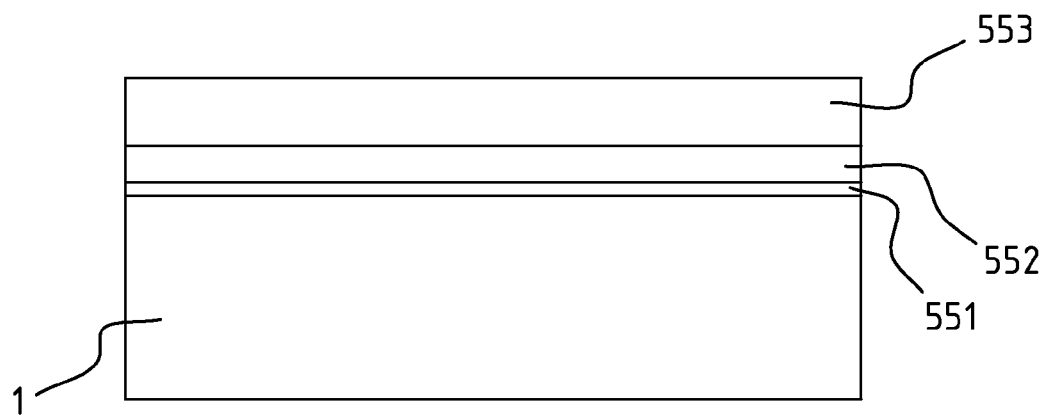
FIGS. 5a-h illustrate embodiments of the present disclosure where a deep trench isolation gap is closed according to embodiments of the disclosure.

As illustrated by FIG. 5a, an oxide layer 551 is formed on top of a semiconductor substrate 1. Preferably, this oxide layer 551 has a thickness of less than about 25 nm, and more preferably has a thickness of about 10 nm. Then, a nitride layer 552 is formed on the oxide layer 551. Preferably, this nitride layer 552 has a thickness of less than about 300 nm, and more preferably has a thickness of about 115 nm. The oxide layer 551 prevents strain effects from the nitride layer 552 onto the substrate 1. The nitride layer 552 can be used to protect the substrate 1, 551 during later planarization steps such as chemical mechanical polishing.

On top of the nitride layer 552 a second oxide layer 553 is formed. Preferably, this second oxide layer 553 has a thickness of less than about 5 micron, more preferably has a thickness between about 100 nm and about 500 nm, and more preferably has a thickness of about 300 nm. This oxide layer 553 can be used as a hard mask for subsequent etching steps, more particularly as a hard mask for the etching of the cavity in the substrate 1.

Figure 5B:
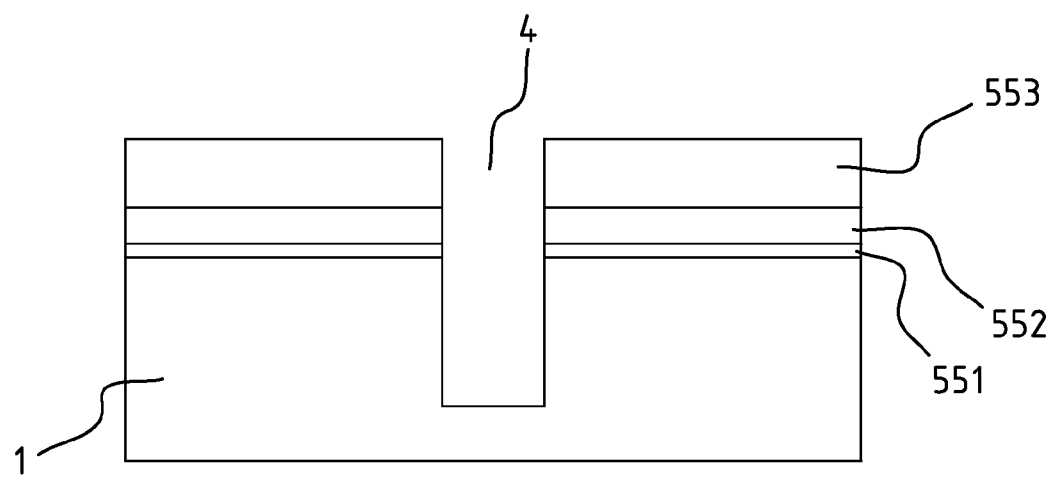

After depositing the stack of layers 551, 552, 553, this layer stack and the substrate 1 are patterned to form the cavity 4 as illustrated by FIG. 5b.

Figure 5C:
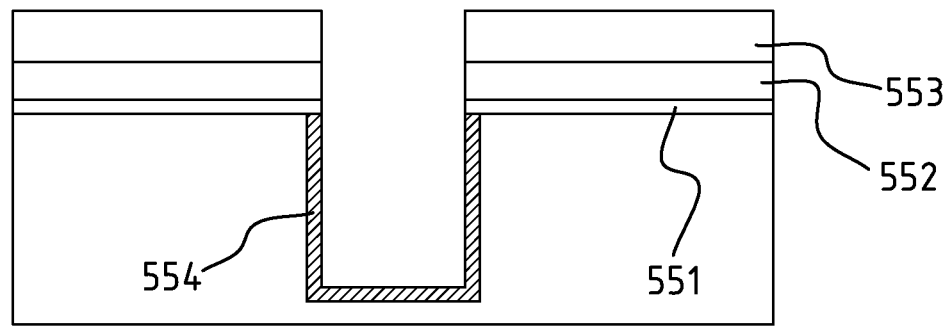

Optionally a first liner 554 is formed at least on the walls and the bottom of cavity (See, e.g., FIG. 5c). This first liner 554 is needed if the sacrificial material 555, used to at least partially fill the cavity, can not be removed selectively with respect to the substrate 1. If the substrate 1 is a silicon substrate such as a bulk silicon wafer or a silicon-on-insulator wafer (SOI), this first liner 554 can be formed by oxidation of the silicon. This oxide liner can be formed by deposition, e.g. by forming a TEOS layer. Preferably this liner has a thickness of about 20 nm.

Figure 5D:
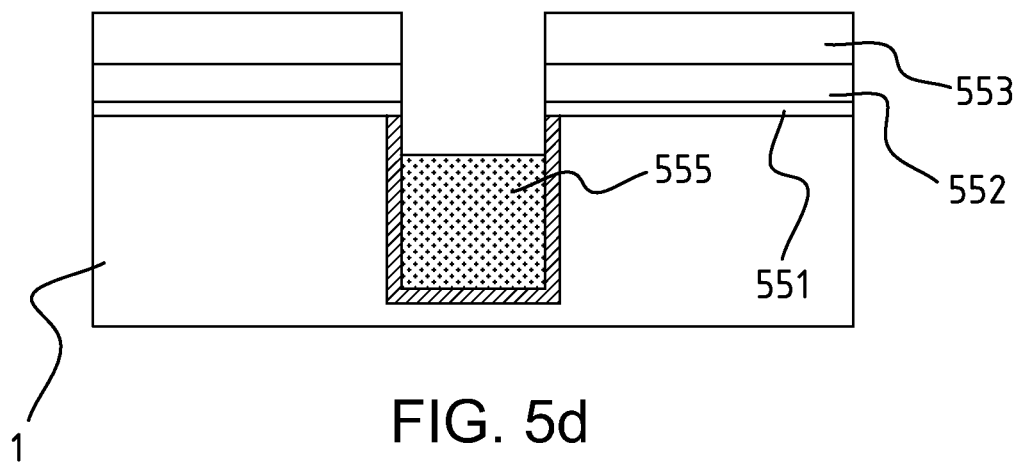
Figure 5E:
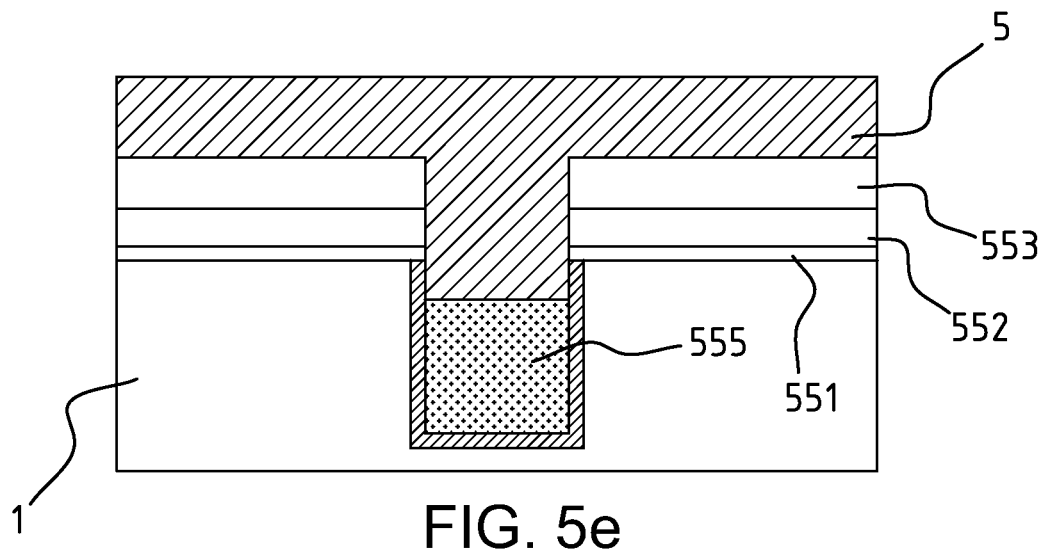

After forming the cavity 4, and after optionally forming the first liner 554, the cavity 4 is at least partially filled with a sacrificial material 555 as illustrated by FIG. 5d. In one embodiment a 1200 nm poly-silicon layer is deposited overlying the substrate 1 and filling the cavity 4. This layer is then removed as to only have poly-silicon layer in the cavity. The removal of the silicon in excess of the cavity can be done in several steps In a first step the silicon is planarized, e.g., by Chemical Mechanical Polishing (CMP), whereby the layer stack 551-552-553 (optionally including layer 554) is used as a CMP stopping layer, thereby removing all silicon material above the level of the stack 551-552-553. In second step the upper part of the silicon in the cavity is removed, e.g. by dry etch, thereby forming a partially filled cavity as the silicon material fills the cavity to a level below the top surface of the stack 551-552-553.

Figure 5F:
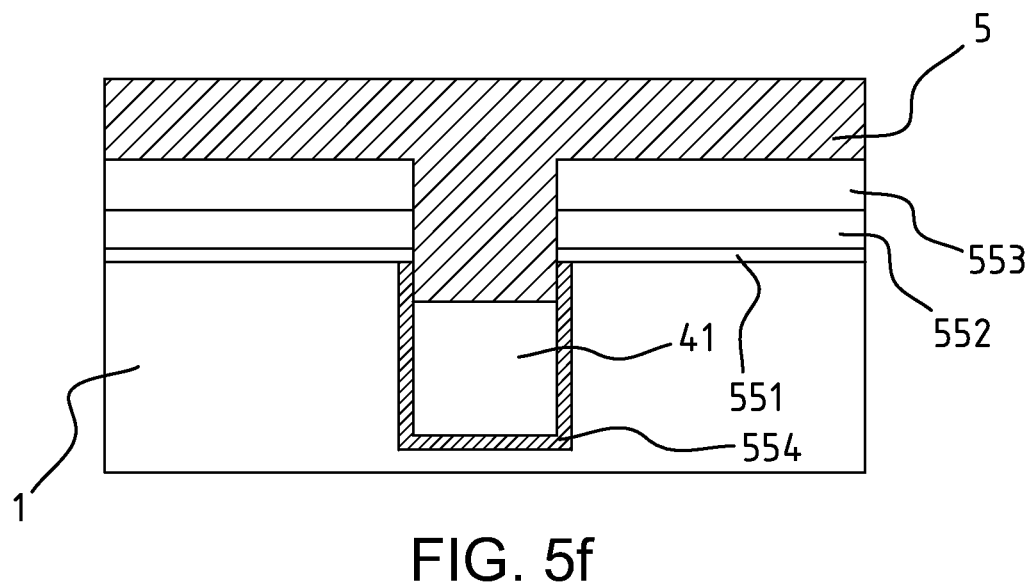

Overlying the at least partially filled trench, a first capping layer 5 is formed (See FIG. 5e) whereby local defects in this first capping layer allow removal of the sacrificial layer 555 from the cavity. The removal process must be selective towards the substrate 1 in order to maintain the dimensions of the cavity, if not the first liner 554 protects the layer in which the cavity is formed. In one embodiment this sacrificial material 555 is poly-silicon which can be removed for example by a $SF_6$ based isotropic dry etch plasma, although other reactive gas techniques such as down stream etching and wet etching can be used as well. During the removal process, the sacrificial material 555 is converted into gaseous elements that can diffuse through the first capping layer due to the presence of the local defects. The removal of the sacrificial material 555 must be selective towards the substrate material, and results in the cavity 41, as illustrated in FIG. 5f.

A deposition of, for instance, a second capping layer and optionally further capping layer can be performed in order to seal the cavity 41.

The first capping layer is preferably non-conductive, e.g., it can comprise or consist of SiC. Optionally, additional field isolation structures surrounding and, preferably aligned to, the sealed deep trench can be formed.

Figure 5G:
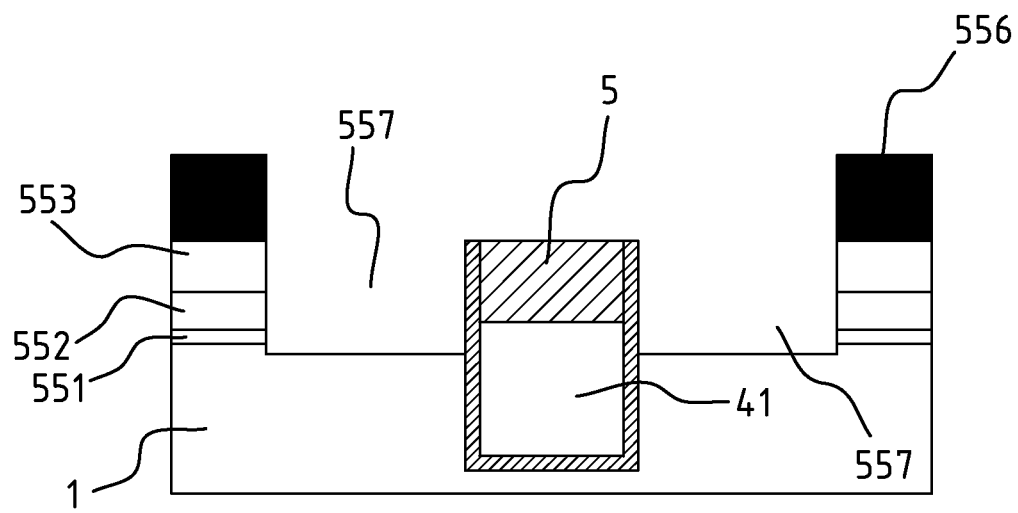

The capping layer 5 is then removed up until the level of the top of the layer stack 551, 552, 553, such that only within cavity 41 material is left over. The field area is patterned by forming a resist pattern 556 on the substrate using photolithographic patterning. As shown in FIG. 5g, this resist pattern 556 can expose the sealed air gap and the field regions where field oxide is to be formed. Using the resist pattern 556 as a mask, the layers 551 and 552 and 553 and the substrate 1 are etched to form the shallow trenches 557 of the field isolation as is done in shallow trench field isolation (STI). Typically, the etch depth in the substrate is 300-400 nm. Layers 551, 552, and 553 can be dry etched with fluorine based chemistry (e.g., $CF_4$, $C_2F_6$, $CHF_3$, $CH_2F_2$, $SF_6$, etc.). Preferably, the substrate dry etch is based upon a $Cl/HBr/O_2/He/N_2$ chemistry and has good selectivity towards oxide. In order to have good filling of the shallow trenches 557, the etch in the substrate 1 preferably has a slope.

Figure 5H:
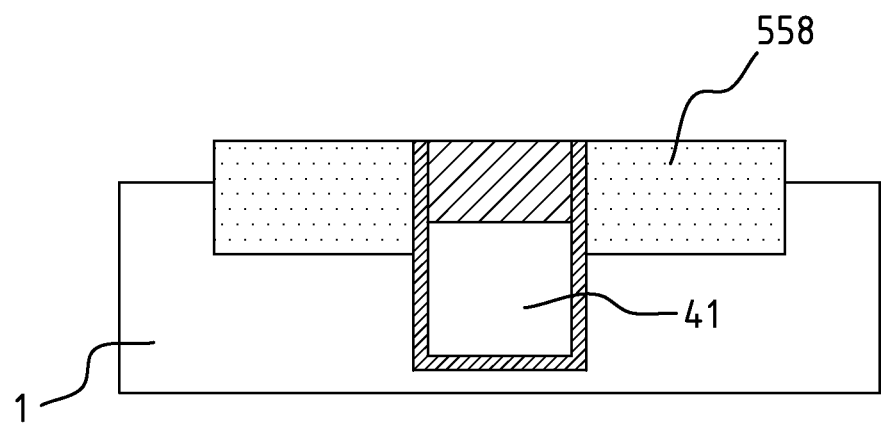

After forming the shallow trenches 557 surrounding the sealed deep trench and removing the resist pattern 556, the shallow trenches 557 are filled with a dielectric material, preferably an oxide 558 as shown in FIG. 5h. This oxide can be planarized to the level of layers 553 or 552 or 551.

Finally, the layer 553, the nitride layer 552, and the oxide layer 551 are removed to expose the active areas separated from each other by the deep trench and, optionally as shown in FIG. 5h, by shallow trenches.

In order to reduce the capacitive coupling between the conductive lines, e.g., Cu wires, in a BEOL interconnect scheme, one can remove the dielectric material in which these conductive lines are embedded thereby creating so called air bridges. An example of such process flow is described below.

On top of a substrate, typically comprising active and/or passive devices such as transistors, capacitors, resistors or coils, a stack of dielectric and patterned conductive layers is formed. The dielectric layers electrically isolate the conductors within each conductive layer and between conductive layers. Conductors located at different levels in this stack are then in physical connect with each-other via openings formed in the intermediate dielectric layer. These conductor wires interconnect active and/or passive devices and allow contacting these devices. This stack of dielectric and patterned conductive layers is hence also known as an interconnect scheme.

After manufacturing the interconnect scheme a passivation layer is formed overlying the substrate. This passivation layer provides a sealing of the underlying interconnect scheme towards the atmosphere. Typically nitride is used to form this passivation layer. In this passivation layers openings, known as bond pads, are present to electrically contact conductors at the top level of the interconnect scheme. Also, through holes are present through which the dielectric layers are exposed. Via the latter openings the dielectric layers surrounding the patterned conductive layers can be removed, thereby creating a cavity containing the patterned conductive layers.

As discussed in the other embodiments of this description, these through holes need to be closed to seal the underlying cavity. After depositing the passivation layer 3, through holes 4 are patterned in this passivation layer to expose the dielectric layers 21. A capping layer 5 is formed according the other embodiments of this description thereby creating pathways 51 at least at the edges of the through holes 4. Via these pathways 51 the dielectric materials 21 can be removed thereby creating a cavity 41 containing the patterned conductive layers. This capping layer 5 can be formed a dielectric material such as SiC in which no additional patterning is needed. Also conductive materials such as SiGe can be used to form the capping layer 5, but then this conductive capping layer need to be removed from the locations where bond pads are to be formed, preferably the conductive capping layer 5 is patterned to only cover the through holes 4. Additional layers 6 can be deposited to seal off the pathways 51 in the capping layer.

While some embodiments described herein include some but not other features included in other embodiments, combinations of features of different embodiments are meant to be within the scope of the disclosure, and form different embodiments, as would be understood by the skilled person.

While the principles of the disclosure have been set out above in connection with specific embodiments, it is to be clearly understood that this description is merely made by way of example and not as a limitation of the scope of protection which is determined by the appended claims.

The invention claimed is:

1. A non-porous capping layer having a non-flat topography formed in a semiconductor device, said capping layer comprising defects, said defects being suitable for allowing a predetermined fluid to pass through, wherein said defects are present at locations in said capping layer where its topography is substantially varying.

2. A membrane comprising a stack of a first layer and a non-porous capping layer, said first layer comprising holes and said capping layer being in physical contact with said first layer and said holes, said capping layer comprising local defects positioned at least at sidewalls of said holes, said local defects being suitable for allowing a predetermined fluid to pass through.

3. The membrane according to claim 2, further comprising a layer sealing said capping layer.

4. A microelectronic device comprising a cavity covered by a non-porous capping layer, the non-porous capping layer having a non-flat topography formed in a semiconductor device, said capping layer comprising defects, said defects being suitable for allowing a predetermined fluid to pass through, wherein said defects are present at locations in said capping layer where its topography is substantially varying.

5. The microelectronic device according to claim 4, wherein the predetermined fluid is a removal agent that can pass through the defects in the capping layer and is reactive to a sacrificial layer formed below the capping layer.

6. A microelectronic device comprising a cavity covered by a membrane, the membrane comprising a stack of a first layer and a non-porous capping layer, said first layer comprising holes and said capping layer being in physical contact with said first layer and said holes, said capping layer comprising local defects positioned at least at sidewalls of said holes, said local defects being suitable for allowing a predetermined fluid to pass through.

7. The microelectronic device according to claim 6, wherein the predetermined fluid is a removal agent that can pass through the defects in the capping layer and is reactive to the first layer formed below the capping layer so as to remove the first layer in a region corresponding to the cavity.

* * * * *